(12) United States Patent
Fitzgerald et al.

(10) Patent No.: US 6,504,723 B1
(45) Date of Patent: Jan. 7, 2003

(54) ELECTRONIC ASSEMBLY HAVING SOLDER THERMAL INTERFACE BETWEEN A DIE SUBSTRATE AND A HEAT SPREADER

(75) Inventors: Thomas J. Fitzgerald, Phoenix, AZ (US); Carl L. Deppisch, Phoenix, AZ (US); Fay Hua, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/990,489

(22) Filed: Nov. 15, 2001

(51) Int. Cl.⁷ .................................................. H05K 7/20
(52) U.S. Cl. .......................... 361/705; 257/713; 361/719
(58) Field of Search .............................. 165/80.3, 185; 174/16.3, 52.4; 257/704–707, 710, 713; 361/704, 705, 706, 722, 717–719; 278/56.3, 124.6, 180.21, 180.22; 438/106, 118, 121, 122

(56) References Cited

U.S. PATENT DOCUMENTS

| | | | | |
|---|---|---|---|---|
| 4,034,468 A | * | 7/1977 | Koopman | 29/825 |
| 4,692,791 A | * | 9/1987 | Bayraktaroglu | 257/664 |
| 5,585,671 A | * | 12/1996 | Nagesh et al. | 257/697 |
| 5,977,626 A | * | 11/1999 | Wang et al. | 257/707 |
| 6,146,921 A | * | 11/2000 | Barrow | 438/122 |

* cited by examiner

Primary Examiner—Gerald Tolin
(74) Attorney, Agent, or Firm—Blakley, Sokoloff, Taylor & Zafman LLP

(57) ABSTRACT

An electronic assembly is provided having a die, a heat spreader, and a solidified solder material. A die includes a die substrate and an integrated circuit on a bottom surface of the die substrate. The heat spreader is located above the die and has left and right inclined faces. The left inclined face tapers from a point near a center of the die to a point upward and to the left of the upper surface. The right inclined face tapers from a point near the center upward and to the right above the upper surface. A solidified solder material fills regions between the upper surface and the inclined faces of the lower surface.

15 Claims, 2 Drawing Sheets

ELECTRONIC ASSEMBLY HAVING SOLDER THERMAL INTERFACE BETWEEN A DIE SUBSTRATE AND A HEAT SPREADER

BACKGROUND OF THE INVENTION

1). Field of the Invention

This invention relates to an electronic assembly including a die having an integrated circuit thereon which generates heat when being operated, its construction and materials for cooling.

2). Discussion of Related Art

Integrated circuits are manufactured on semiconductor wafers which are subsequently sawed or "diced" into individual dice. Such a die may have solder bump contacts on the integrated circuit. The solder bump contacts are located downward onto contact pads of a package substrate. Electronic signals can be provided through the solder bump contacts to and from the integrated circuit.

Operation of the integrated circuit causes heating thereof. Heat is conducted to an upper surface of such the die and has to be conducted or convected away to maintain the temperature of the integrated circuit below a predetermined level for purposes maintaining functional integrity of the integrated circuit.

A heat spreader is usually located above the die and thermally coupled to the die by means of a thermal interface material such as thermally conductive grease. The thermally conductive grease transfers minimal stresses from the heat spreader to the die due to differences of thermal expansion between the thermal heat spreader and the die, but has a relatively low thermal conductivity and thus provides a substantial thermal barrier for heat transferring from the die to the heat spreader.

BRIEF DESCRIPTION OF THE DRAWINGS

The invention is described by way of example with reference to the accompanying drawings wherein.

DETAILED DESCRIPTION OF THE INVENTION

Figure 1:
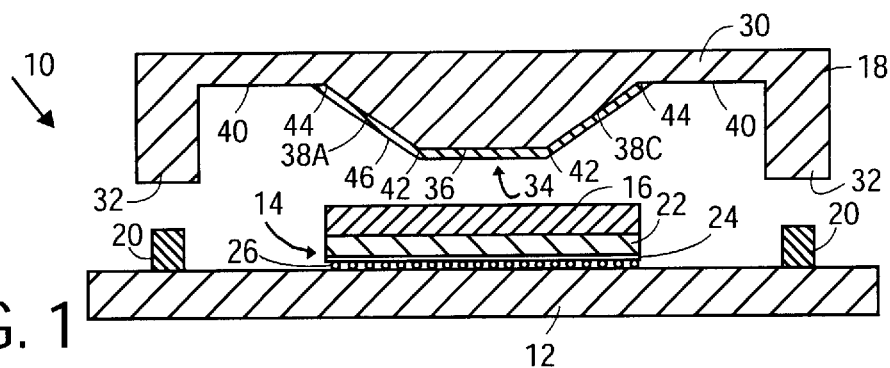
FIG. 1 is a cross-sectional side view of components of an electronic assembly before being assembled.

FIG. 1 of the accompanying drawings illustrates components of an electronic assembly 10 before being finally assembled, including a package substrate 12, a die 14, a preform 16 of solder material, a cap 18, and bonding material 20.

The package substrate 12 is typically in the form of an organic land grid array with contact pads (not shown) on upper and lower surfaces thereof. The contact pads on the upper surface are connected through metal lines to the contact pads on the lower surface. Further details of organic land grid arrays are known in the art.

The die 14 includes a die substrate 22, an integrated circuit 24, and solder bump contacts 26. The die substrate 22 is typically made of silicon and has upper and bottom surfaces. The integrated circuit 24 is formed in and on the bottom surface of the die substrate 22. The contacts 26 are located on a lower surface of the integrated circuit 24. The contacts 26 are manufactured according to a commonly used controlled collapse chip connect (C4) process.

The die 14 is located on the package substrate 12 so that a respective one of the contacts 26 contacts a respective one of the contact pads on the upper surface of the package substrate 12. The combination of the package substrate 12 and the die 14 is then located within a reflow furnace where the contacts 26 are heated to above their melting temperature, and then allowed to cool, thereby permanently attaching each of the contacts 26 to a respective contact pad on the package substrate 12.

The bonding material 20 is applied on the upper surface of the package substrate 12. The bonding material 20 has adhesive and sealing properties and is located along edges of the upper surface of the package substrate 12 around the die 14.

The preform 16 is located on the entirely flat exposed upper surface of the die substrate 22. When viewed from above, the preform 16 conforms substantially in shape to a shape of the die substrate 22 so that edges of the preform 16 are located along edges of the die substrate 22. The preform 16 may be between 100 and 200 microns thick and typically includes indium.

Figure 2:
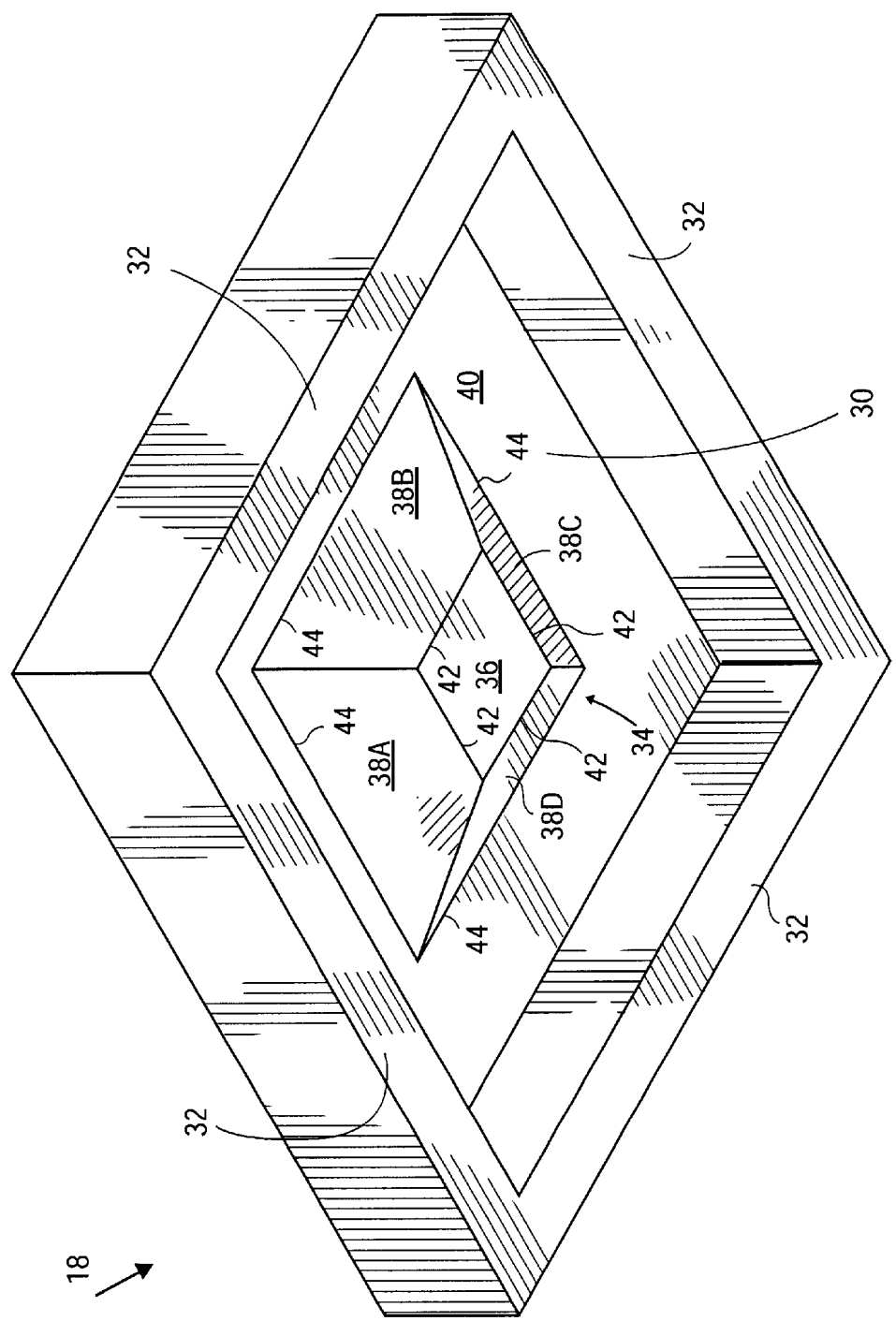
FIG. 2 is a perspective view of a cap of the electronic assembly.

FIG. 2 illustrates the cap 18 in more detail. The cap 18 is typically made of copper so as to be highly thermally conductive. The shape of the cap 18 is obtained in a stamping operation. The cap 18 includes a central heat spreader portion 30 and four sides 32. Each side 32 extends from a respective edge of the heat spreader 30. A recess is formed jointly by a lower surface of the heat spreader 30 and inner surfaces of the sides 32.

The lower surface of the heat spreader 30 is formed with a formation 34. The formation 34 is an inverted frustum of a pyramid having a square base. The formation 36 has a horizontal square central face 36 and four inclined faces 38A–D. The lower surface of the heat spreader 30 has a square region 40 that entirely surrounds the formation 34. The region 40 and the central face 36 are both horizontal and the central face 36 is located in a lower plane than the region 40. Each one of the inclined faces 38A–D, for example the inclined face 38A, has a lower edge 42 at a respective edge of the central face 36, and an upper edge 44 at the region 40. The respective inclined face 38A–D is located at a small angle (shown exaggerated), for example about 1°, relative to horizontal so that the respective inclined face 38A–D extends from the edge 42 upwardly and sideways away from the central face 36. The upper edge 44 may be located 100 to 200 microns higher than the lower edge 42. The upper edges 44 of the inclined faces 38A–D jointly form a base, located at the top, of the inverted pyramid.

Referring again to FIG. 1, the entire formation 34 is covered with a fluxing agent 46. A fluxing agent may also be located on the die substrate 22. Fluxing agents are known in the art and serve to remove oxygen from a solder material and soldering surfaces when the solder material is melted. The cap 18 is located over the package substrate 12 and the die 14 so that the central face 36 is located over a center of the preform 16 and a center of the die substrate 22. The sides 32 are all located above the bonding material 20. As seen in FIG. 1, the inclined faces 38A and 38C form left and right faces respectively. The inclined face 38A has a lower edge 42 located above the die substrate 22 between the center of the die substrate 22 and a left edge of the die substrate 22, and an upper edge 44 located approximately above a left edge of the die substrate 22. The inclined face 38C has a lower edge 42 located above the die substrate 22 between a center of the die substrate 22 and a right edge of the die substrate 22, and an upper edge 44 located approximately above the right edge of the die substrate 22.

Figure 3:
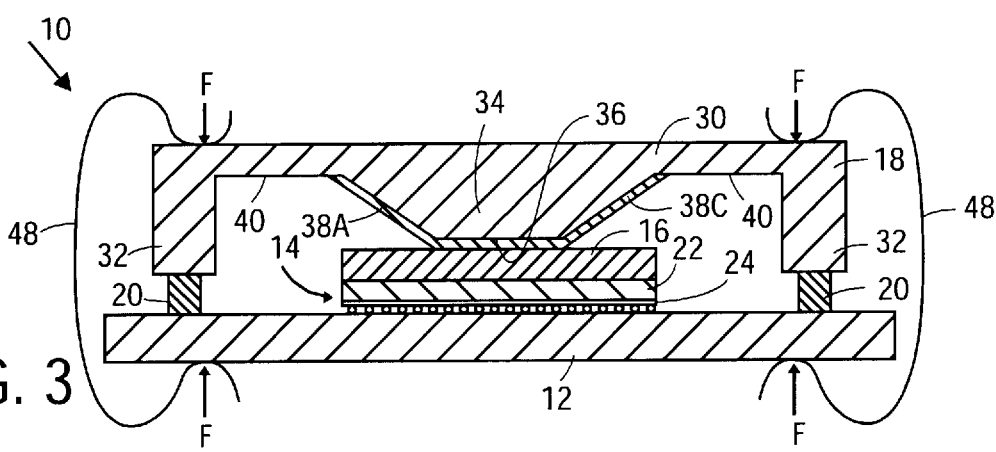
FIG. 3 is a view similar to FIG. 2 after the cap is brought into contact with a solder preform and spring clips are located over the components.

FIG. 3 illustrates the components of the electronic assembly 10 after the central face 36 of the heat spreader 30 is moved vertically down onto a central region of the preform 16. Spring clips 48 are located over the package substrate 12 and the cap 18 and create forces F that bias the central face 36 against an upper surface of the preform 16. Further movement of the cap 18 toward the package substrate 12 is prevented because the solder material of the preform 16 is in a solid state. The inclined faces 38A–D do not contact the horizontal upper surface of the preform 16.

The assembly as shown in FIG. 3 is then located in a furnace and heated to a temperature above the melting temperature of the solder material of the preform 16. The preform 16 may, for example, include indium, which melts at 157° C.

Figure 4:
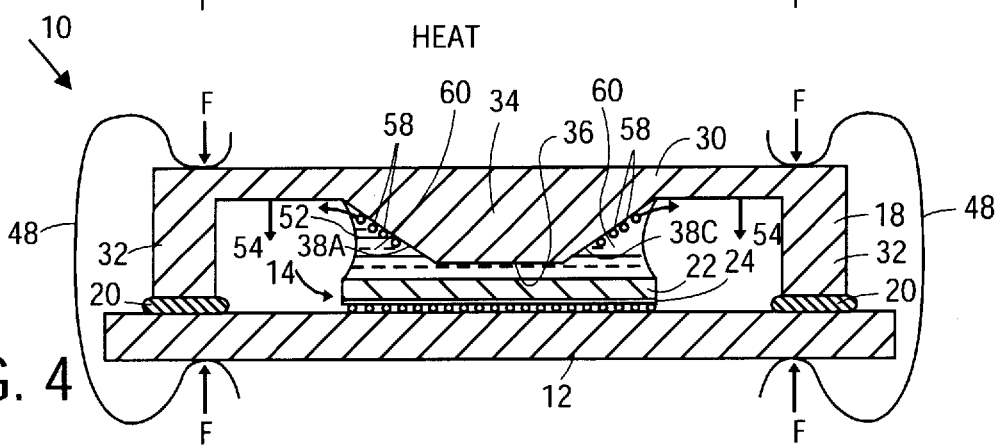
FIG. 4 is a view similar to FIG. 3 after the components are heated so as to melt the material of the preform.

FIG. 4 illustrates the assembly of FIG. 3 after it is located in a furnace and heated so that the solder material of the preform 16 forms a solder mass 52. Under the forces F, the cap 18 is also moved in a direction 54 toward the package substrate 12. The central face 36 moves downward toward the upper surface of the die substrate 22. Melted solder flows out from between the central face 36 and the die substrate 22. Melted solder flows under capillary action and covers the inclined faces 38A–D.

The temperature at which the solder material melts is also above a temperature at which the fluxing agent 46 vaporizes so that vaporized bubbles 58 of the fluxing agent are formed in the solder mass 52. Because of the force F and the inclined orientation of the faces 38A–D, the bubbles 58 move horizontally out of the solder mass 52. It may occur that some of the bubbles 58 remain in the solder mass 52, but they are primarily located above outer regions of the die substrate 22 as opposed to above a center of the die substrate 22.

The bonding material 20 is compressed and melted. The bonding material 20 forms a seal between the cap 18 and the package substrate 12 around the die substrate 22.

The assembly 10 of FIG. 4 is then cooled to room temperature, either actively or passively. While being cooled, the solder mass 52 tends to solidify first at its outer edges, i.e., near edges of the die substrate 22, and where it is the thinnest, i.e., below the central face 36. The solder mass 52 approximately below a center of each one of the inclined faces 38A–D acts as a respective reservoir 60 of a liquid solder. The solder contracts while it solidifies so that solder is drawn from a respective reservoir 60 into the region below the central face 36. The process is continued until all the solder solidifies.

Figure 5:
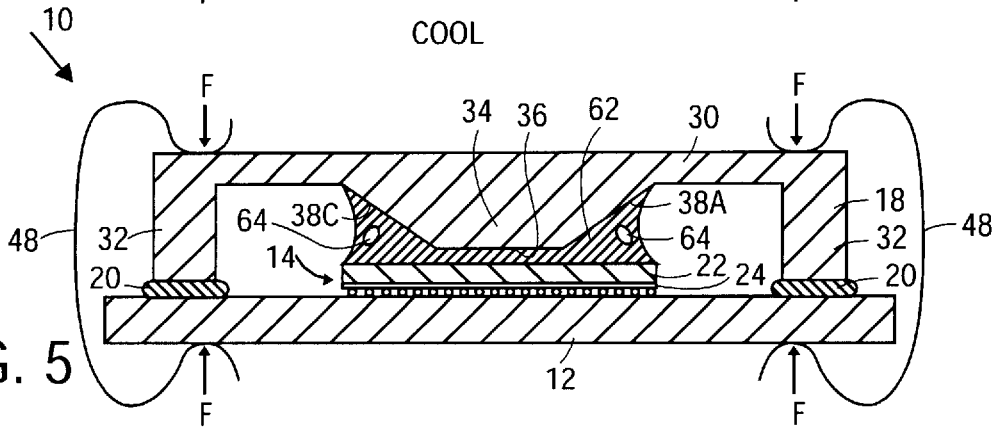
FIG. 5 is a view similar to FIG. 4 after the components are cooled to solidify the material.

FIG. 5 illustrates the assembly 10 after it is cooled to room temperature. The faces 38A–D taper away from the upper surface of the die substrate 22. A thermal interface 62 of solid solder material is located in a space between the formation 34 and the die substrate 22. The thermal interface 62 has a lower surface contacting an upper surface of the die substrate 22, and an upper surface contacting the central face 36 and the inclined faces 38A–D. Voids 64 may be formed where the reservoirs 60 used to be.

In use, electric signals are provided to the integrated circuit 24. Operation of the integrated circuit 24 causes heating thereof. Heat is conducted from the integrated circuit 24 through the die substrate 22 and the thermal interface 62 to the heat spreader 30. The heat conducts horizontally through the heat spreader and is convected or conducted from an upper surface of the heat spreader 30.

The materials of the package substrate 12, the die substrate 22, and the cap 18 have different coefficients of thermal expansion. The differences in coefficients of thermal expansion cause differences in expansion when heated by the same degree. The differences in expansion cause stresses on the thermal interface 62. These stresses are relatively small above a center of the die substrate 22 and relatively large above edges of the die substrate 22. However, because the thermal interface 62 is relatively thick above edges of the die substrate 22, it can absorb more of the stresses. At the same time, the thermal interface 62 is relatively thin above a central region of the die substrate 22 and thus provides a small thermal resistance for heat conducting from the die substrate 22 into the formation 34. Solid solder is preferred for the thermal interface 62 over interface materials such as thermal greases because of its higher thermal conductivity, but the thermal conductivity of solid solder is still below the thermal conductivity of the copper of the cap 18. A thin solder above the center of the die substrate 22 is thus desirable but undesirable above outer regions of the die substrate 22.

The formation 34 has an inverted frustum pyramidal shape with a square base, which has distinct benefits. The square base matches the square shape of the die, thereby spreading stresses more uniformly than a shape not matching the shape of the die. Another embodiment may have a pyramidal shape which has an apex. It may also be possible to form similar shapes on a die substrate instead of or in addition to formations formed on a heat spreader.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An electronic assembly comprising:
    a die including a die substrate and an integrated circuit in and on a bottom surface of the die substrate;
    a heat spreader above the die so that a space is defined between an upper surface of the die substrate and a lower surface of the spreader, the space having a larger vertical height near an edge of the upper surface than near a center of the upper surface; and
    a solidified solder material in the space and contacting the upper and lower surfaces.

2. The electronic assembly of claim 1 wherein the space is at least 100 microns wider near the edge than near the center.

3. The electronic assembly of claim 1 wherein the upper and lower surfaces taper away from one another.

4. The electronic assembly of claim 1 wherein the surfaces are substantially equidistantly spaced in a central region surrounding the center.

5. The electronic assembly of claim 4 wherein the surfaces taper away from one another from an edge of the central region to the edge of the upper surface.

6. The electronic assembly of claim 1 wherein the upper surface is entirely flat and the lower surface is lower above the center than above the edge.

7. The electronic assembly of claim 6 wherein the upper surface has an inclined face that is inclined relative to horizontal so as to taper away from the lower surface.

8. The electronic assembly of claim 7 wherein the upper surface has a central face that is substantially horizontal so as to be substantially equidistantly spaced from the lower surface.

9. The electronic assembly of claim 1 wherein the die includes a plurality of contacts on the integrated circuit.

10. The electronic assembly of claim 9, further comprising:
   a package substrate, the contacts being located on the package substrate.

11. The electronic assembly of claim 10 wherein the thermal spreader forms part of a cap that has sides extending downward from edges of the thermal spreader past the die.

12. The electronic assembly of claim 11 wherein the sides are secured to the package substrate.

13. An electronic assembly comprising:
   a die including a die substrate having substantially flat upper and bottom surfaces and an integrated circuit in and on the bottom surface;
   a heat spreader above the die, the heat spreader having left and right inclined faces, the left inclined face tapering from a point at or near a center of the die to a point upward and to the left over the upper surface, and the right inclined face tapering from a point at or near the center upward and to the right above the upper surface; and
   a solidified solder material filling regions between and contacting the upper surface and the inclined faces of the lower surface.

14. The electronic assembly of claim 13 wherein the heat spreader has a central face between the left and right faces, which is substantially equidistantly spaced from the upper surface.

15. The electronic assembly of claim 13 wherein voids are formed in the solder material, there being fewer voids near the center of the die than near an edge of the die.

* * * * *